(12) United States Patent
Mathew et al.

(10) Patent No.: US 6,686,245 B1
(45) Date of Patent: Feb. 3, 2004

(54) VERTICAL MOSFET WITH ASYMMETRIC GATE STRUCTURE

(75) Inventors: Leo Mathew, Austin, TX (US); Michael Sadd, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/324,787

(22) Filed: Dec. 20, 2002

(51) Int. Cl.⁷ .............................................. H01L 21/336
(52) U.S. Cl. .................... 438/283; 438/275; 438/286; 438/304
(58) Field of Search ................... 438/268, 275, 438/279, 283, 286, 587, 303, 304

(56) References Cited

U.S. PATENT DOCUMENTS

| | | | |
|---|---|---|---|
| 5,413,948 A | * 5/1995 | Pfiester et al. | 438/152 |
| 5,480,838 A | * 1/1996 | Mitsui | 438/270 |
| 5,969,384 A | * 10/1999 | Hong | 257/322 |
| 6,143,636 A | * 11/2000 | Forbes et al. | 438/587 |
| 6,492,212 B1 | * 12/2002 | Ieong et al. | 438/157 |

OTHER PUBLICATIONS

Wolf et al, "Silicon Processing for the VLSI Era vol. 1—Process Technology", 1986, Lattice Press, p. 175–182.*

* cited by examiner

*Primary Examiner*—Amir Zarabian
*Assistant Examiner*—Jamie L. Brophy
(74) *Attorney, Agent, or Firm*—Joseph P. Lally

(57) ABSTRACT

A semiconductor fabrication process and structure in which a semiconductor channel structure (140) having first and second major surfaces perpendicular to a semiconductor substrate (102) is formed overlying and electrically isolated from the substrate (102). First and second gate dielectrics (120, 142) are formed on the channel structure's first and second major surfaces respectively. First and second gate dielectrics (120, 142) differ in at least one characteristic. First and second gate electrodes (116, 152) are formed in contact with the first and second gate dielectrics (120, 142) respectively. The first and second gate electrodes (116, 152) differ in at least one characteristic. First and second gate dielectrics (120, 142) may have different dielectric constants while first and second gate electrodes (116, 152) may have different doping and conducting properties.

19 Claims, 4 Drawing Sheets

VERTICAL MOSFET WITH ASYMMETRIC GATE STRUCTURE

CROSS REFERENCE TO RELATED APPLICATION

The subject matter disclosed in this application is related to the subject matter disclosed in U.S. patent application Ser. No. 10/285,059 filed Oct. 31, 2002 by Mathew et al. entitled Multiple gate transistor employing monocrystalline silicon walls. Both of these applications are subject to assignment to a common assignee.

BACKGROUND OF THE INVENTION

1. Field of the Invention

The present invention relates generally to the field of semiconductor fabrication and, more particularly, to the fabrication of a multiple-gate transistor.

2. Description of Related Art

A conventional metal-oxide-semiconductor (MOS) transistor is typically characterized by a structure in which a gate electrode is displaced above the transistor channel region by an intermediate gate dielectric film. The region below the channel may include the bulk substrate or an epitaxial film. The transistor is operated by applying a bias to the gate electrode. The bulk material is likely grounded or biased to a constant voltage. Thus, the conventional transistor may be described as having a single-sided gate since the gate exists on only one side of the channel.

It is generally recognized that single-sided gate transistors inherently exhibit operational characteristics, including leakage current, drive current, and sub-threshold slope, that are less than ideal. These parameters are particularly critical in low power applications such as wireless technology. Multiple-gate transistor structures, in which gate dielectrics and gate electrodes are formed on two (or more) sides of the transistor channel, have been proposed to address this problem.

Typical multiple-gate transistor structures employ a "symmetric" design in which the gate electrode on both sides of the channel is the same material, doping, conductivity, and so forth. Similarly, the gate dielectrics on both sides of the channel are the same. Symmetric multiple gate transistors have been found to suffer from a threshold voltage control problem. For example, n-channel threshold voltages in symmetric multi-gate sub-micron transistors using p+ poly gates and undoped or lightly doped channels have been found to be in the range of 0.9 V whereas threshold voltages of approximately 0.1 to 0.4 V are required for optimum performance. Accordingly, it would be desirable to implement a process enabling the formation of asymmetric, multiple-gate transistors. It would be further desirable if the implemented process did not substantially add to the complexity of the process and did not require the use of new materials and/or equipment.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Reference will now be made in detail to presently preferred embodiments of the invention, examples of which are illustrated in the accompanying drawings. It should be noted that the drawings are in simplified form and are not to scale. Although the following description refers to the illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention. Thus, for example, the following description does not address the interconnection of the transistors formed or other processing generally referred to as "back end" processing.

Generally speaking, the present invention encompasses a semiconductor fabrication process for forming a self-aligned, asymmetric, multi-gate transistor. The channel structure of the transistor is a substantially monocrystalline wall that extends substantially perpendicularly from the wafer substrate surface. The opposing faces of the wall form (at least) two surfaces on which a gate dielectric and gate electrode may be formed. The gate dielectric formed on a first face of the wall may differ from the gate dielectric formed on the second face. Similarly, the gate electrode formed on the first face of the wall may differ from the gate electrode formed on the second face.

Figure 1:
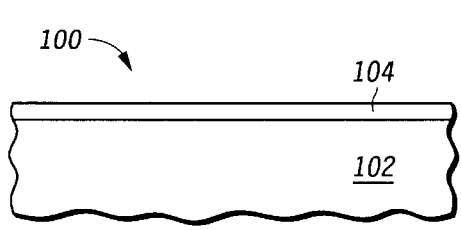
FIG. 1 is a partial cross sectional view of a semiconductor wafer or substrate over which a dielectric has been formed.

Turning now to the drawings, FIGS. 1–22 illustrate portions of a semiconductor integrated circuit fabricated according to the present invention at selected stages in the processing sequence. Referring to FIG. 1, a partial, cross-sectional view of a semiconductor wafer 100 is presented. Wafer 100 is typically a substantially circular slice of a semiconductor material such as silicon having a diameter of 150 to 300 mm. A substrate 102 of wafer 100 includes monocrystalline silicon, which may be doped or undoped. In a silicon-on-insulator (SOI) embodiment of wafer 100, substrate 102 may reside over a dielectric (not depicted) such as silicon oxide. In other embodiments, substrate 102 may reside over a bulk silicon material (not depicted) that provides mechanical support to wafer 100.

As depicted in FIG. 1, a dielectric layer 104 is formed over substrate 102. In one embodiment, dielectric layer 104 includes silicon dioxide that is grown by exposing substrate 102 to an oxygen bearing ambient maintained at a temperature in excess of 800° C. In another embodiment, dielectric layer 104 includes a chemically vapor deposited (CVD) silicon oxide formed from an oxygen bearing source such as tetraethylorthosilicate (TEOS). Dielectric layer 104 may also include silicon nitride, another dielectric, or a combination thereof. A thickness of dielectric layer 104 is typically in the range of 20 to 100 nm. Dielectric layer 104 provides electrical isolation between substrate 102 and a subsequently formed gate electrode structures as well as providing an etch stop for use when patterning the subsequently formed electrodes.

Figure 2:
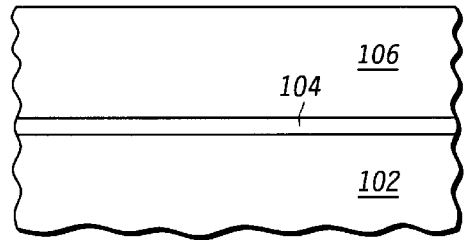
FIG. 2 illustrates processing subsequent to FIG. 1 in which a first gate material is formed over the dielectric.

Referring to FIG. 2, a first gate electrode layer 106 is formed over dielectric layer 104. As its name implies, first gate electrode layer includes a layer from which a first gate electrode of the transistor will be formed. In an embodiment designed to minimize polysilicon depletion effects in the subsequently formed gate electrode, first gate electrode layer 106 is formed by a CVD process using in-situ doping to achieve a saturated doping concentration in the deposited film.

In one implementation of the in-situ doping embodiment, first gate electrode layer 106 is a boron-saturated (p+) polysilicon film formed by the thermal decomposition of a silane ($SiH_4$) bearing ambient at a temperature in the range of roughly 600 to 650° C. To achieve in-situ doping of the deposited film, a boroncontaining containing element or compound such as diborane is provided in the ambient. In contrast to conventional gate electrode layer processes in which the deposited polysilicon is doped using ion implantation, in situ doping of first gate electrode layer 106 beneficially produces a significantly higher doping concentration in the deposited film thereby beneficially reducing the resistivity of the deposited film and minimizing polysilicon depletion effects commonly encountered in implant-doped poly structures. First gate electrode layer 106 preferably has a thickness of roughly 50 to 100 nm and a resistivity of $1 \times 10^{-3}$ Ω-cm or less.

In an alternative embodiment desirable for its compatibility with conventional CMOS processes, first gate electrode layer 106 may be formed by the CVD of undoped polysilicon., the subsequent implantation of an impurity such as boron, phosphorous, arsenic, or antimony. The implant-doped polysilicon is then typically annealed at a temperature in the range of approximately 900 to 1000° C. The anneal may include a rapid thermal anneal in which individual wafers are heated to a temperature in excess of 1000° C. for a duration of less than 60 seconds.

Figure 3:
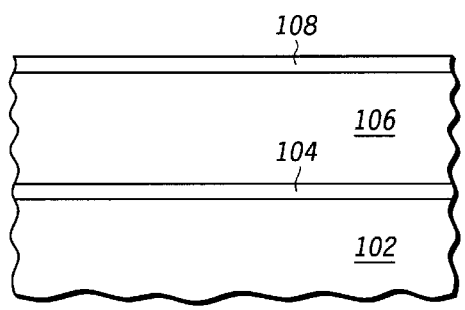
FIG. 3 illustrates processing subsequent to FIG. 2 in which a second dielectric is deposited over the first gate material.

Referring now to FIG. 3, a second dielectric layer 108 is formed over first gate electrode layer 106. Second dielectric layer 108 preferably includes silicon nitride desirable for its impurity barrier properties and for its use as an oxidation mask to prevent the oxidation of first gate electrode layer 106 during one or more subsequent oxidation processes. In embodiments where second dielectric layer 108 does include silicon nitride, a layer of silicon oxide is preferably formed between the nitride and first gate electrode layer 106 to reduce stress caused when silicon nitride contacts silicon or polysilicon. Second dielectric layer 108 may be formed by a plasma enhanced CVD (PECVD) process in which silane and ammonia are reacted in a radio frequency plasma at a temperature of roughly 200 to 400° C. A thickness of second dielectric layer 108 is preferably in the range of approximately 5 to 25 nm.

Figure 4:
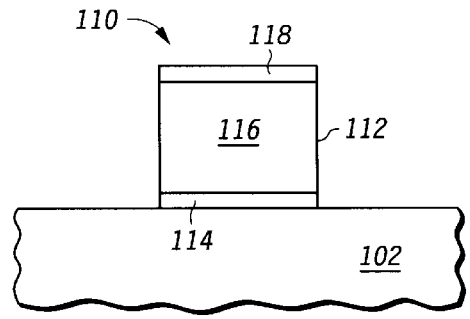
FIG. 4 illustrates processing subsequent to FIG. 3 in which the deposited layers are patterned to form a stack.

Referring to FIG. 4, first dielectric layer 104, first gate electrode 106, and second dielectric layer 108 are etched to form a structure 110 that includes the remaining portions 114 of first dielectric layer 104, the remaining portions 116 of first gate electrode layer 106, and the remaining portions 118 of second dielectric layer 108. Structure 110 is typically formed using dry or plasma etch process that produces substantially vertically oriented surfaces or sidewalls 112 extending substantially perpendicular from an upper surface of substrate 102. The etch process that forms structure 110 may include steps optimized for the etch of each layer in the structure. With respect to an embodiment of structure 110 having a silicon nitride portion 118 over a p+ polysilicon portion 116 over a silicon-oxide portion 114, for example, the etch process may include a $CF_4$—$O_2$ plasma step optimized to etch silicon nitride, a chlorine-based plasma step optimized to etch polysilicon, and a $CF_4$—$H_2$ optimized to etch silicon oxide.

Figure 5:
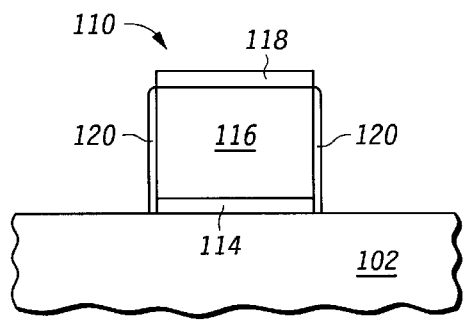
FIG. 5 illustrates processing subsequent to FIG. 4 in which a first gate dielectric is formed on sidewalls of the stack.

Referring to FIG. 5, a first gate dielectric 120 is formed on sidewalls 112 of structure 110. In one embodiment, first gate dielectric 120 is formed by thermally oxidizing the polysilicon portion 116 of structure 110 by exposing wafer 100 to an oxygen bearing ambient maintained at a temperature in excess of 800° C. In this embodiment, it will be appreciated that, because silicon nitride portion 118 of structure 10 does not oxidize significantly, first gate dielectric 120 is formed primarily on the sidewalls of polysilicon portion 116 and, to a lesser extent, silicon oxide portion 114. The thermal formation embodiment of first gate dielectric 120 will oxidize an upper surface of substrate 102. In this embodiment, the formation of first gate dielectric 120 includes an etch step in which the portions of the thermally formed dielectric that are not on the sidewalls of structure 110 are removed to expose the semiconductor portion of substrate 102. This etch process would likely be a reactive ion etch (RIE) or other anisotropic dry etch process using a fluorocarbon (e.g., $CF_4$) based plasma.

In an alternative embodiment, first gate dielectric 120 may be a spacer structure formed by CVD or ALD (atomic layer deposition) of a silicon-oxide compound or a "high-K" material followed by an anisotropic dry etch. For purposes of this disclosure, high-K materials include metal-oxide compounds having a dielectric constant of greater than 5.0. Exemplary high-K materials suitable for use as first gate dielectric 120 include metal-oxide compounds in which the metal component is a Group III, IV, or V transition metal such as titanium (Ti), tantalum (Ta), hafnium (Hf), zirconium (Zr), lanthanum (La), niobium (Nb), and yttrium (Y). The metal-oxide compounds suitable for use as a high-K material in first gate dielectric 120 may include a third element such as nitrogen. The thickness of first gate dielectric 120 is likely in the range of approximately 2 to 10 nm depending upon its dielectric constant and the desired transistor parameters.

Figure 6:
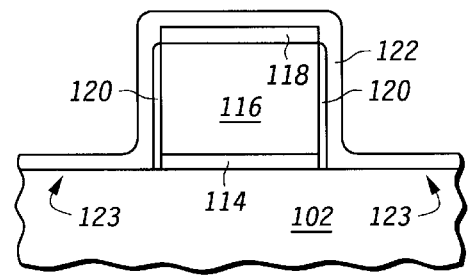
FIG. 6 illustrates processing subsequent to FIG. 5 in which an active source/channel/drain material is deposited over the first gate dielectric and the stack.

Referring now to FIG. 6, a transistor channel film 122 is formed over substrate 102 and structure 110. Transistor channel film 122 provides the material that will ultimately function as the channel region of the resulting transistor. In the preferred embodiment, it is desirable to employ a monocrystalline channel region in the transistor. To achieve a monocrystalline channel region, the depicted embodiment includes depositing (FIG. 6) an amorphous transistor channel film and subsequently crystallizing (FIG. 7) the amorphous film. In silicon-based embodiments, therefore, channel film 122 may include or substantially consist of amorphous silicon. The formation of an amorphous silicon channel film 122 may be achieved using silane-based CVD at a temperature in the range of approximately 400 to 500° C. The thickness of transistor channel film 122 is likely in the range of approximately 10 to 30 nm. Portions of channel film 122 are seen contacting exposed portions 123 of semiconductor substrate 102.

Figure 7:
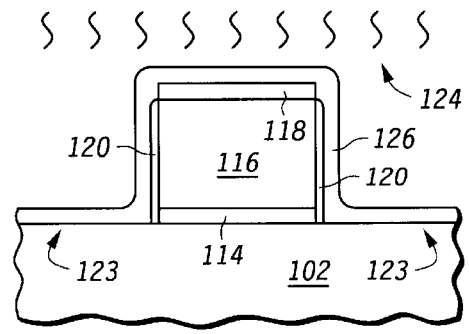
FIG. 7 illustrates processing subsequent to FIG. 6 in which the active source/channel/drain material is crystallized by a heating process.

Referring to FIG. 7, the amorphous channel film 122 is crystallized by exposing wafer 100 as depicted in FIG. 6 to an inert ambient 124 maintained at a temperature in the range of 400 to 600° C. Inert ambient 124 may include nitrogen, argon, or both to convert silicon film 122 to a substantially monocrystalline film 126. During this process, the portions 123 of monocrystalline silicon substrate 102 in contact with portions of channel film 122 serve as a crystallization seed that provides a starting point for the crystallization of film 122. It is theorized that the resulting crystallization of film 122 begins at the portions of film 122 in contact with substrate 102, proceeds up the sidewalls of film 122 (those portions in contact with sidewalls of structure 110), and converges at the portion of film 122 on top of structure 110. Although lattice imperfections may result where the crystalline portions converge on top of structure 110, the portions of the resulting monocrystalline film 126 on the sidewalls of structure 110 are theorized to include or substantially consist of monocrystalline silicon. It is these sidewall portions of film 126 that will ultimately serve as the channel portion of a field effect transistor (FET). Thus, any lattice imperfections occurring on top of structure 110 should not impair transistor performance.

Figure 8:
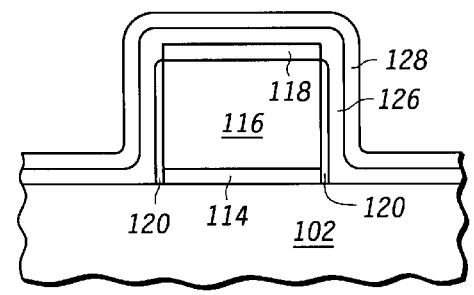
FIG. 8 illustrates processing subsequent to FIG. 7 in which a dielectric is formed over the crystallized material.
Figure 9:
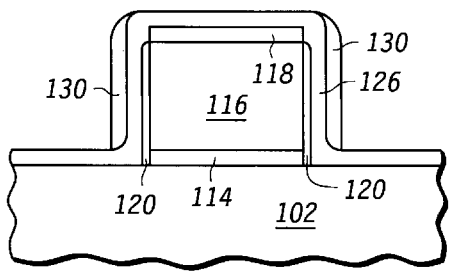
FIG. 9 illustrates processing subsequent to FIG. 8 in which the dielectric is etched to form spacers exposing portions of the crystallized material.

Referring now to FIG. 8 and FIG. 9, dielectric spacers 130 are formed on the sidewalls of monocrystalline channel film 126. Formation of dielectric spacers 130 is likely achieved by first depositing a dielectric film 128 (FIG. 8) over substrate 102 and structure 110. Dielectric film 128 is preferably chose to prevent oxidation of selected portions of the underlying structures. Thus, dielectric film 128 is likely to include an oxidation inhibiting dielectric such as silicon nitride. In this embodiment, dielectric film 128 may include or substantially consist of PECVD silicon nitride formed by exposing wafer 100 to a silane/ammonia plasma at a temperature in the range of approximately 300 to 400° C.

Dielectric film 128 is then subjected to an anisotropic dry etch to produce dielectric spacers 130, which are the portions of film 128 remaining after the etch. Spacer formation is well known in the field of semiconductor fabrication. Portions of monocrystalline channel film 126 are exposed by the formation of spacers 130. More specifically, the horizontal portions of film 126 (those portions not on the sidewalls of structure 110) are exposed following the formation of spacers 130. These horizontal portions include the horizontal portions of film 126 on top of structure 110 as well as the portions of film 126 in contact with substrate 102.

Figure 10:
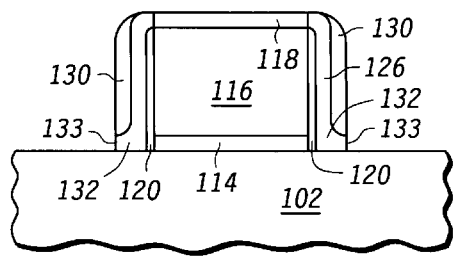
FIG. 10 illustrates processing subsequent to FIG. 9 in which the exposed portions of the crystallized material are removed.

Referring now to FIG. 10, an etch process is performed to remove the exposed portions of transistor channel film 126. For embodiments in which film 126 comprises silicon, the etch process of FIG. 10 likely includes a $CF_4$—$O_2$ plasma based etch. The removal of the exposed portions of film 126 creates preliminary transistor channel structures 132, which themselves have an exposed surface 133 at the foot of structures 132.

Figure 11:
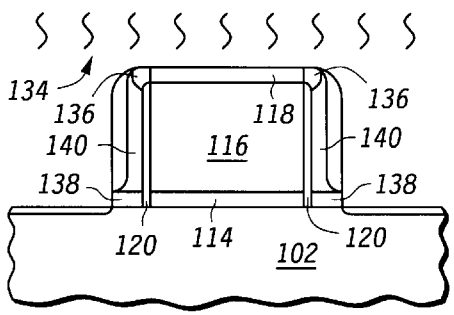
FIG. 11 illustrates processing subsequent to FIG. 10 in which extremity portions of the crystallized material are oxidized to isolate the remaining portions.

Referring now to FIG. 11, wafer 100 is exposed to an oxygen bearing ambient 134 maintained at a temperature of at least 800° C. to oxidize exposed portions of transistor structures 132. In addition to the exposed portions 133 at the foot of structures 132 as shown in FIG. 10, the top of structures 132 may include exposed portions where spacers 130 and remaining portions 118 of the second dielectric layer meet. The oxidation of these exposed portions of structures 132 produces oxide structures 136 at the top and oxide structures 138 at the bottom of the transistor channel structure. The remaining portion of each transistor channel structure (i.e., those portions of structures 132 not oxidized by ambient 134) is indicated by reference numeral 140. Transistor channel structures 140 are electrically and physically isolated from substrate 102 of wafer 100 by oxide structures 138.

Figure 12:
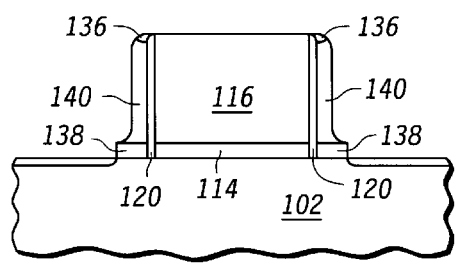
FIG. 12 illustrates processing subsequent to FIG. 11 in which the dielectric spacers are removed.

Referring to, FIG. 12, spacer structures 130 and remaining portions 118 of the second dielectric layer are removed. In embodiments where structures 130 and layer 118 both comprise silicon nitride, the removal process may include a wet etch in which wafer 100 is dipped in a phosphoric acid solution maintained at an elevated temperature of approximately 180° C. The removal of spacers 130 exposes sidewall portions of transistor channel structures 140 as well as an upper surface of first gate electrode 116.

Figure 13:
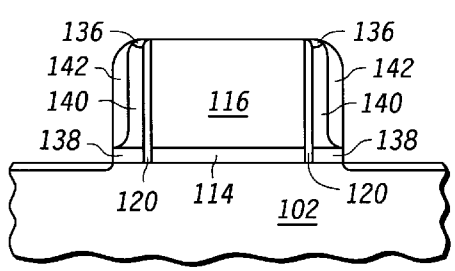
FIG. 13 illustrates processing subsequent to FIG. 12 in which a second gate dielectric is formed on the crystallized material.

Referring to FIG. 13, second gate dielectric 142 is formed on the exposed or outer sidewalls of transistor channel structures 140. Similar to first gate dielectric 120, second gate dielectric 142 may include thermally formed silicon-oxide compounds, deposited silicon-oxide compounds, CVD or ALD metal-oxide or other high-K compounds, or a combination thereof. Forming second gate dielectric structure 142 exclusively on sidewalls of transistor channel structures 140 is accomplished by anisotropically etching the second gate dielectric film, which is either grown or deposited substantially conformally across wafer 100. The invention thus employs separate processes for forming first and second gated dielectric structures thereby enabling greater process control over the characteristics of the final transistor. While first gate dielectric 120 may comprise thermally formed silicon dioxide having a first thickness, second gate dielectric 142 may include a CVD metal-oxide high-K component such having a second thickness.

In an alternative processing sequence, second gate dielectric 142 may be formed prior to the formation of spacers 130. In this embodiment, second gate dielectric 142 may be formed following the crystallization of film 126 as depicted in FIG. 7. This embodiment may promote an interface between second gate dielectric 142 and channel structures 140 having fewer defects.

Figure 14:
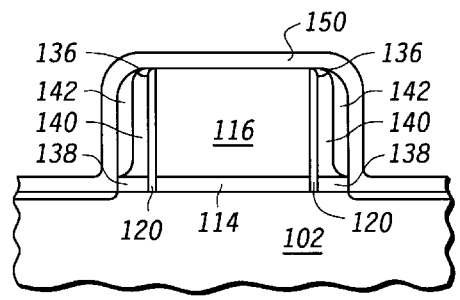
FIG. 14 illustrates processing subsequent to FIG. 13 in which a second gate material is deposited over the substrate.

Referring now to FIG. 14, a second gate electrode film 150 is deposited over wafer 100. Second gate electrode 150 provides a film from which the transistor's second gate electrode will be formed. In one embodiment, second gate electrode 150 comprises CVD polysilicon. In this embodiment, second gate electrode may be formed with an in situ doping process in which a dopant gas is introduced into the reactor chamber along with a silane or other suitable silicon source. Alternatively, second gate electrode film 150 may be doped more conventionally by implanting an undoped CVD polysilicon film with an impurity such as boron, arsenic, phosphorous, or antimony.

In one embodiment, second gate electrode film 150 is doped with an impurity having a conductivity type opposite of the conductivity type of first gate electrode 116. If, for example, first gate electrode 116 is p+ polysilicon, second gate electrode may comprise n+ polysilicon. The ability to form an asymmetric transistor having a first gate electrode of a first conductivity type and a second gate electrode of a second conductivity type advantageously increases the controllability of the transistor's operating characteristics. As discussed previously, symmetrically formed, multiple gate, sub-micron transistors have been found to exhibit unacceptable threshold voltages and it is believed that the use of asymmetric gate electrodes in conjunction with asymmetric gate dielectrics, can produce transistors with more desirable threshold voltages.

Figure 15:
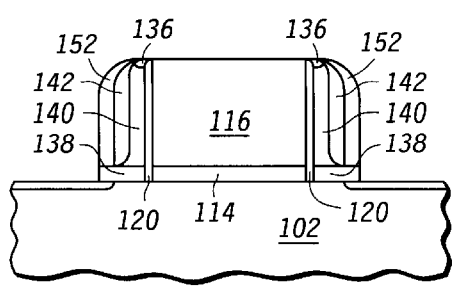
FIG. 15 illustrates optional processing subsequent to FIG. 14 in which the second gate material is etched to form second gate material spacers.

Referring to FIG. 15, second gate electrode film 150 is etched anisotropically to produce second gate electrode spacers 152 on sidewalls of second gate dielectic 142. Spacers 152 represent the portions of film 150 remaining after the etch. A likely thickness of spacers 152 is in the range of approximately 5 to 20 nm. Spacer structures 152 will serve as an outer gate electrode that modulates an exterior surface of channel structure 140 while first gate electrode 116 will serve as an inner gate electrode that modulates an interior surface of channel structure 140.

Figure 16:
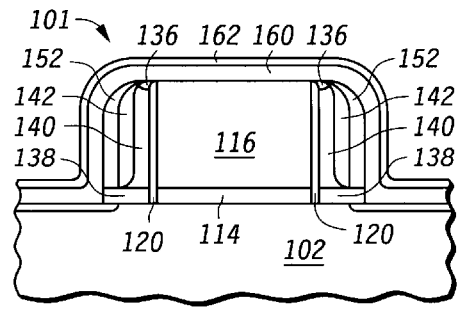
FIG. 16 illustrates processing subsequent to FIG. 15 in which a conductive film and an anti-reflective coating or blocking layer are deposited over the substrate and stack.

Referring to FIG. 16, a conductive film 160 is deposited over wafer 100 to connect first gate electrode 116 and second gate electrode spacers 152 electrically. In addition, a capping layer 162 is deposited over film 160. Capping layer 162 serves as an anti-reflective coating and/or as an implant block during subsequent steps, particularly the source/drain processing. Film 160 may include multiple conductive layers and may include a barrier metal designed to minimize unwanted interaction between the underlying silicon and an overlying interconnect of copper or aluminum. Film 160 may include, as examples, polysilicon, titanium, tantalum, and composites of titanium, tantalum, silicon, and nitrogen. Thus, film 160 may include a tantalum silicon nitride film overlying a titanium film. A thickness of conductive film 160 is preferably in the range of approximately 75 to 500 nm.

Capping layer 162 is likely a dielectric film such as PECVD silicon nitride although other forms of silicon nitride (such as low pressure LPCVD silicon nitride) and other dielectrics may be used. Capping layer 162 has a thickness of approximately 50 to 150 nm.

Figure 17:
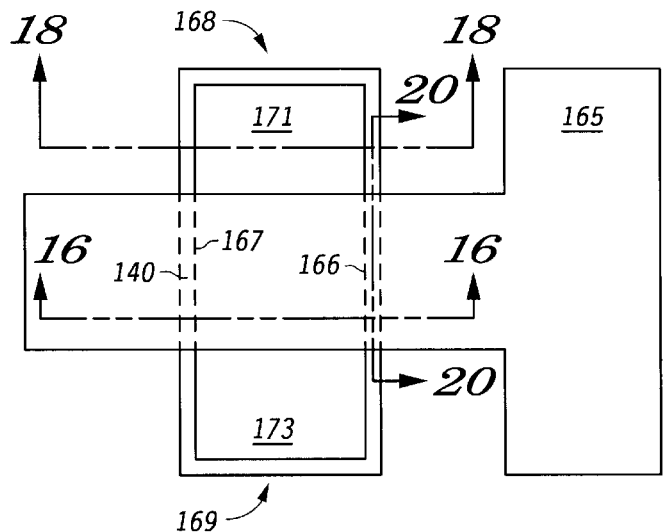
FIG. 17 is a top view illustrating processing subsequent to FIG. 16 in which the conductive film is patterned to form a gate structure.
Figure 18:
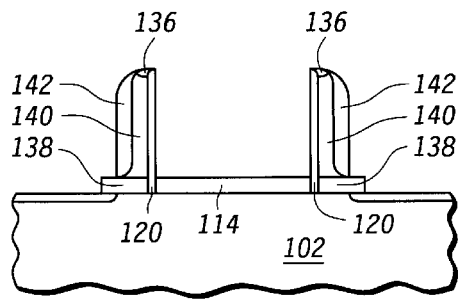
FIG. 18 is a partial cross-sectional taken along line 18—18 of FIG. 17.

Referring now to FIG. 17, a top view of selected portions of wafer 100 is presented following a processing step in which layers 160 and 162 of FIG. 16 are patterned with conventional lithography and etch processes to define a transistor gate 165. Gate 165 includes those portions of layer 160 remaining after the etch. In the depicted embodiment, the transistor channel structure 140 is substantially rectangular as seen from the top and gate 165 overlies portions of two of the rectangle's walls identified by reference numerals 166 and 167. Portions 168 and 169 of channel structure 140 not covered by gate 165 will serve as the source and drain of the transistor. For this reason, the regions enclosed by the "uncovered" portions of structure 140 are referred to herein as source/drain regions 171 and 173.

In addition to removing portions of conductive film 160, the gate etch process preferably removes first gate electrode portion 116 and second gate electrode spacers 152 where they are not covered by gate 165. Thus, as shown in the cross sectional view of FIG. 18, which is taken along the line 18—18 of FIG. 17, first gate electrode portion 116 has been removed in the transistor's source/drain regions 171 and 173. A first source/drain implant may be performed at this point to introduce a first source/drain impurity distribution 161 (see FIG. 20, which is a cross-section taken along line 20—20 of FIG. 17 after completion of a subsequent processing described below) into channel structure 140 disposed on either side of gate 165.

The patterning of gate 165 leaves sidewall portions of gate 165 that are exposed. It is preferable to cap these exposed sidewall portions of gate 165 to prevent inadvertent contact to the gate. In one embodiment, this capping of gate 165 sidewalls is accomplished by a dielectric spacer formation sequence including a conformal deposition step followed by an anisotropic step in the same manner as discussed above. The spacers thus formed on the sidewalls of gate 165 are preferably silicon nitride although other dielectrics may be substituted.

Figure 19:
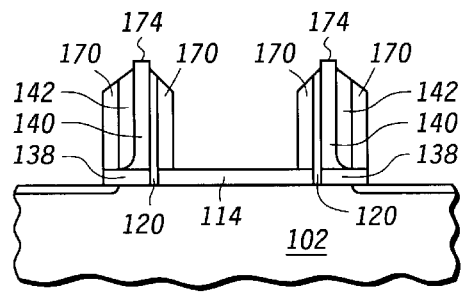
FIG. 19 and FIG. 20 illustrate processing subsequent to FIG. 17 in which spacers are formed on sidewalls of the patterned gate electrode.
Figure 20:
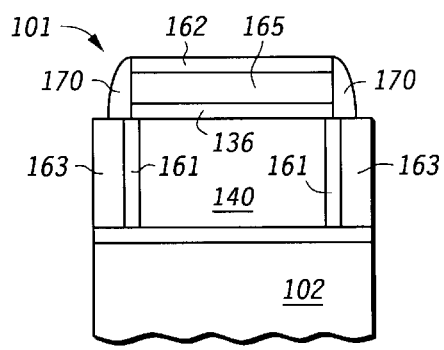

It will be appreciated by those skilled in semiconductor fabrication having the benefit of this disclosure that performing a spacer formation sequence on wafer 100 as depicted in FIG. 17 will produce spacers 170 on sidewalls of gate 165 as shown in FIG. 20. In addition, however, spacers 170 will also be formed on sidewalls of structures 140 (or the gate dielectrics 142 and 120) in source/drain regions 171 and 173 as shown in FIG. 19, which is a cross-section taken along line 18—18 after completion of the spacer sequence). Following the formation of spacers 170, a second source/drain implant can be performed to introduce a second source/drain impurity distribution 163 into structure 140 (See FIG. 20). The presence of spacers 170 during this second source/drain implant results in the boundary of second source/drain impurity distribution 163 being laterally displaced from the boundary of first source/drain impurity distribution 161. In this embodiment, first source/drain impurity distribution 161 is likely of the same polarity as, but less heavily doped than second source/drain impurity distribution 163 to achieve a lightly-doped drain or extension implant effect. Alternatively, the first and second impurity distributions 161 and 163 may be fabricated using appropriately angled implants and implant energies prior to the formation of spacers 170.

The formation of spacers 170 as shown in FIG. 19 preferably includes an over-etch or a subsequent dip that exposes a top portion 174 of structure 140. The top portion 174 of structure 140 provides a seed for a subsequent growth of source/drain structures large enough to receive a conventional contact.

Figure 21:
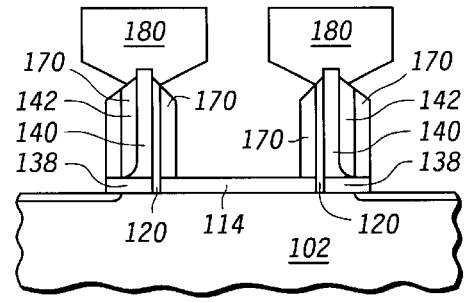
FIGS. 21 and 22 illustrate a top view and cross sectional views of processing subsequent to FIG. 19 in which source/drain structures are formed.
Figure 22:
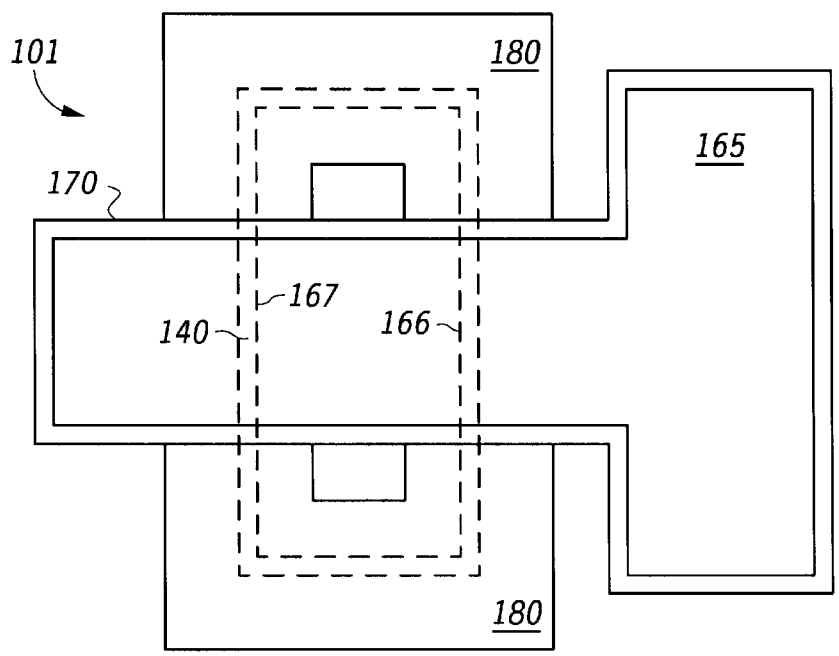

Referring to FIG. 21 and FIG. 22, source/drain structures 180 are formed in contact with the top portion 174 of structure 140. Source/drain structures 180 are preferably sized sufficiently to receive a conventional contact opening enabling a subsequently formed interconnect layer to make source/drain contacts. Source/drain structures 180 may be grown epitaxially by exposing the wafer to a silicon bearing ambient at a temperature in the range of approximately 600 to 1000° C.

The formation of source/drain structures 180 substantially completes the fabrication of a transistor 101 according to the present invention as shown in FIG. 22. The illustrated embodiment of transistor 101 includes a gate 165 that electrically connects a first gate electrode 116 to a second gate electrode 142. (See FIG. 16). First and second gate electrodes 116 and 142 are disposed on either side of a channel structure 140. A first gate dielectric is intermediate between first gate electrode 116 and channel structure 140 while a second gate dielectric 142 is intermediate between second gate electrode 152 and channel structure 140.

Channel structure 140 is preferably a monocrystalline semiconductor wall structure that is isolated from and extends substantially perpendicularly from an upper surface of the substrate 102. In the depicted embodiment, in which channel structure 140 is rectangular as seen from the top, gate 165 is draped over two portions (166 and 167) of structure 140. (See FIG. 17). With respect to each portion 166 and 167, gate 165 effectively modulates two major surfaces of structure 140, the first surface being the surface of structure 140 contacting first gate dielectric 120 and the second surface being the surface contacting second dielectric 142. Thus, transistor 101 has an effective width (W) that is roughly 4X the height of channel structure 140.

In one embodiment, first gate electrode 116 and second gate electrode 152 differ in thickness and doping polarity with first gate electrode 116 being p+ doped while second gate electrode 152 is n+ doped. Moreover, both first and second gate electrode 116 and 152 are preferably doped nearly at or in excess of saturated doping levels to minimize poly depletion effects during transistor operation. In addition, first and second gate dielectrics 120 and 142 may be asymmetrical such that their thickness, compositions, and/or dielectric constants differ from one another.

Thus it will apparent to those skilled in the art having the benefit of this disclosure that there has been provided, in accordance with the invention, a process for fabricating a multiple-gate field effect transistor that achieves the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended claims and equivalents thereof.

What is claimed is:

1. A process of forming a transistor, comprising:
    forming a semiconductor channel structure having first and second major surfaces, the channel structure overlying and electrically isolated from a semiconductor substrate;
    forming first and second gate dielectrics on the first and second major surfaces respectively, wherein the first and second gate dielectric differ in at least one characteristic selected from the set of characteristics consisting of dielectric constant and material composition; and
    forming first and second gate electrodes in contact with the first and second gate dielectrics respectively, wherein the first and second gate electrodes differ.

2. The process of claim 1, wherein forming the channel structure includes forming the channel structure having first and second major surfaces substantially parallel to one another and substantially perpendicular to an upper surface of the substrate.

3. The process of claim 1, wherein forming the first gate dielectric comprises forming silicon oxide or silicon nitride and the forming the second gate dielectric comprises depositing a metal-oxide compound having a dielectric constant in excess of 5.0.

4. The process of claim 1, wherein forming the first and second gate electrodes comprises doping the first gate electrode with a dopant of a first polarity and doping the second gate electrode with a dopant of a second polarity wherein the first and second polarities differ.

5. The process of claim 4, wherein forming the first and second gate electrodes comprises chemically vapor depositing polysilicon.

6. The process of claim 5, wherein doping the first and second gate electrode comprises in-situ doping of the first and second gate electrodes during first and second depositions of the respective electrodes.

7. The process of claim 1, further comprising depositing a conductive film to strap the first and second gate electrodes electrically.

8. The process of claim 7, wherein depositing the conductive film comprises depositing a titanium layer and a tantalum silicon nitride layer thereon.

9. The process of claim 7, further comprising patterning the conductive film to form a gate structure and thereafter implanting exposed portions of the channel structure with at least a first source/drain impurity.

10. The process of claim 9, further comprising forming dielectric spacers on sidewalls of the gate structure and thereafter implanting a second source/drain impurity into the exposed portions of the channel structure where the concentration of the first source/drain impurity is less than the concentration of the of the second source/drain impurity.

11. The process of claim 1, wherein forming the channel structure comprises forming a first structure having at least one sidewall, depositing a semiconductor film over the first structure, and crystallizing the deposited semiconductor film.

12. The process of claim 11, wherein depositing the semiconductor film comprises chemically vapor depositing a layer comprising amorphous silicon.

13. A semiconductor process, comprising:
    forming a semiconductor wall over an upper surface of a semiconductor substrate, wherein the wall is electrically isolated from the substrate;
    forming first and second gate dielectrics contacting first and second faces respectively of the semiconductor wall wherein dielectric constants of the first and second gate dielectrics differ;
    forming first and second gate electrodes contacting the first and second gate dielectrics respectively, wherein a doping of the first and second gate electrodes differs and wherein the first and second gate electrodes lie over a channel portion of the wall; and
    forming source/drain structures contacting portions of the wall not covered by the first and second gate electrodes.

14. The method of claim 13, wherein the first gate electrode is characterized as a p+ polysilicon gate electrode and the second gate electrode is characterized as an n+ polysilicon gate electrode.

15. The method of claim 14, wherein a thickness of the first dielectric differs from a thickness of the second dielectric.

16. The method of claim 13, wherein one of the first and second gate dielectrics comprises thermally formed silicon oxide and the other gate dielectric comprises a dielectric selected from a CVD high-K dielectric, and an ALD high-K dielectric.

17. A process of forming a transistor, comprising:

forming a semiconductor channel structure having first and second major surfaces, the channel structure overlying and electrically isolated from a semiconductor substrate;

forming first and second gate dielectrics on the first and second major surfaces respectively, wherein the first and second gate dielectric differ in at least one characteristic; and forming first and second gate electrodes in contact with the first and second gate dielectrics respectively, wherein the first and second gate electrodes differ in at least one characteristic;

wherein forming the channel structure comprises forming a first structure having at least one sidewall, depositing a semiconductor film over the first structure, and crystallizing the deposited semiconductor film.

18. The process of claim 17, wherein forming the first gate dielectric comprises forming silicon oxide or silicon nitride and the forming the second gate dielectric comprises depositing a metal-oxide compound having a dielectric constant in excess of 5.0.

19. The process of claim 17, further comprising depositing a conductive film to strap the first and second gate electrodes electrically.

* * * * *

UNITED STATES PATENT AND TRADEMARK OFFICE
CERTIFICATE OF CORRECTION

PATENT NO. : 6,686,245 B1
DATED : February 3, 2004
INVENTOR(S) : Mathew et al.

It is certified that error appears in the above-identified patent and that said Letters Patent is hereby corrected as shown below:

Column 10,
Line 44, change "of the of the" to -- of the --

Signed and Sealed this

Tenth Day of August, 2004

JON W. DUDAS
*Acting Director of the United States Patent and Trademark Office*